United States Patent [19]
Izumino

[11] Patent Number: 4,799,129
[45] Date of Patent: Jan. 17, 1989

[54] FLAT CABLE CONNECTING DEVICE

[75] Inventor: Satomi Izumino, Tokyo, Japan

[73] Assignee: Tanashin Denki Co., Ltd., Tokyo, Japan

[21] Appl. No.: 945,810

[22] Filed: Dec. 24, 1986

[30] Foreign Application Priority Data

Apr. 7, 1986 [JP] Japan ............................ 61-52003[U]

[51] Int. Cl.⁴ .............................................. H02B 1/20
[52] U.S. Cl. ...................................... 361/428; 361/413
[58] Field of Search .............. 339/17 F; 361/198, 393, 361/413, 428

[56] References Cited

U.S. PATENT DOCUMENTS

| | | | |
|---|---|---|---|
| 3,766,439 | 10/1973 | Isaacson | 361/398 |
| 3,795,885 | 3/1974 | Desso et al. | 361/398 |
| 3,805,213 | 4/1974 | Austin | 361/398 |
| 3,873,889 | 3/1975 | Leyba | 361/398 |
| 4,175,310 | 11/1978 | Reardon, II | 339/17 F |
| 4,394,707 | 7/1983 | Consoli | 361/398 |
| 4,598,337 | 7/1986 | Wuthrich et al. | 361/398 |
| 4,602,317 | 6/1986 | Rounyak et al. | 339/17 F |

FOREIGN PATENT DOCUMENTS 2851858 5/1979 Fed. Rep. of Germany ...... 361/398

Primary Examiner—A. D. Pellinen
Assistant Examiner—Gregory P. Thompson
Attorney, Agent, or Firm—Wegner & Bretschneider

[57] ABSTRACT

A flat cable connecting device which is conveniently used where a flat cable must be passed through a slit formed in a partition wall in order to establish connection thereof with connector pins. The flat cable connecting device includes a flat cable of essentially uniform width having a plurality of printed wires printed thereon. A small hole at one end of the flat cable extends through one of the printed wires for receiving one of the connector pins located on a printed circuit board, thereby establishing mechanical and electrical connection between the flat cable and the printed circuit board. A plurality of printed wire connecting sections are located at one or more edges of the flat cable and electrically connected to the corresponding printed wires, while a plurality of conductor sections are printed on the printed circuit board for electrically connecting the printed wire connecting sections to the corresponding connector pins.

4 Claims, 3 Drawing Sheets

FLAT CABLE CONNECTING DEVICE

BACKGROUND OF THE INVENTION

1. Field of the Invention

This invention relates to a flat cable connecting device which is suitable for connecting an end of a flat cable, which extends through a slit formed in a partition wall to connector pins.

2. Description of the Prior Art

A flat cable is used, for example, for connection between a rotary transformer located within a cylinder of a rotary head mechanism of a video tape recorder and connector pins located outside the cylinder. Conventionally, a slit is formed in a partition wall of the cylinder so as to allow the flat cable to extend therethrough.

However, in a flat cable connecting device as described above, if the slit formed in a circumferential wall of the cylinder is large, dust may readily enter the inside of the cylinder. Further a large slit is undesirable because it reduces the strength of the cylinder. Therefore, it is required to minimize the size of the slit. Meanwhile, the connector pins are disposed in a spaced relationship by a predetermined fixed distance on a printed circuit board which is integral with a connector body. Because it is necessary to assure a distance for insulation between each adjacent pins, and the diameter of the pins cannot be reduced below a particular limit, if the number of the pins is increased, the width of the connecting end of the flat cable must be increased accordingly. As a result, the size of the slit formed in the cylinder must be increased so as to allow the connecting end of the flat cable to pass therethrough. It is also a problem that it is difficult to pass the flat cable through the slit.

FIG. 2 shows a conventional flat cable connecting device having the disadvantages as described above. Referring to FIG. 2, a flat cable 25 has a plurality of printed wires 26 formed thereon and a plurality of small holes 28 formed through the printed wires 26 at an end thereof for receiving therein connector pins 24 securely mounted on a printed circuit board 23 to establish mechanical and electrical connection between the flat cable 25 and the printed circuit board 23. The small holes 28 are arranged in a row extending in a direction perpendicular to a longitudinal axis of the flat cable 25. Accordingly, the end of the flat cable 25 at which the small holes 28 are formed must be widened relative to the body portion of the flat cable 25, as seen in FIG. 2. The flat cable 25 extends through a slit 31 formed in a partition wall 21 such as a circumferential wall of a cylinder of a rotary head mechanism of a video tape recorder. Thus, in connecting the flat cable 25 to the printed circuit board 23, the widened connecting end of the flat cable 25 must be passed through the slit 31, for example, in a manner as shown in phantom in FIG. 2.

A flat cable connecting device as shown in FIG. 3 is also known. In the arrangement of FIG. 3, small holes 28 at a connecting end of a flat cable 25 for receiving therein connector pins 24 on a printed circuit board 23 are arranged in a row extending in a direction parallel to the longitudinal axis of the cable 25. The flat cable 25 is also widened at its connecting end as seen in FIG. 3. Accordingly, a slit 31 formed in a partition wall 21 has a sufficient width to allow the widened connecting end of the flat cable 25 to pass therethrough.

Where the arrangement of FIG. 3 is employed, the connector must be arranged in a vertical direction as seen in FIG. 4. Consequently, the connector and the printed circuit board extend to a position in which they cover part of an outer periphery of a rotary cylinder 32. Accordingly, there is the possibility that a tape may contact the connector or the printed circuit board, and hence the arrangement is not preferable for the application.

SUMMARY OF THE INVENTION

It is an object of the present invention to provide a flat cable connecting device wherein an end of a flat cable at which the flat cable is to be connected to connector pins need not be widened.

It is another object of the invention to provide a flat cable connecting device which can be conveniently passed through a slit formed in a partition wall in order to establish connection thereof with connector pins.

It is a further object of the invention to provide the flat cable connecting device which allows a width of the slit formed in the partition wall to be minimized and makes the operation of passing the flat cable through the slit easier.

In order to attain the objects, according to the present invention, there is provided a flat cable connecting device which includes a flat cable having a plurality of printed wires formed thereon and adapted to extend through a slit formed in a partition member, a connector body, and a printed circuit board integral with the connector body and having a plurality of connector pins disposed thereon. The flat cable has a plurality of small holes formed at an end of the flat cable for receiving therein one of the connector pins to establish mechanical and electrical connection between the flat cable and the printed circuit board, the small hole extending through one of the printed wires on the flat cable. The flat cable also has a plurality of printed wire connecting sections located along the edges of the flat cable and connected to the printed wires for which the small hole is not provided, wherein the printed circuit board has a plurality of conductor sections printed thereon for connecting the printed wire connecting sections to corresponding connector pins.

With the flat cable connecting device of the invention, connection can be established without increasing the width of the one end, that is, the connecting end of the flat cable independently of the number and arrangement of the connector pins. Accordingly, where the flat cable must be passed through a slit formed in a partition wall when it is installed, the size of the slit can be minimized, and the operation of passing the flat cable through the slit can be performed easily and efficiently because the flat cable can be passed straight through.

The above and other objects, features and advantages of the present invention will become apparent from the following description and the appended claims, taken in conjunction with the accompanying drawing.

DESCRIPTION OF THE PREFERRED EMBODIMENTS

Figure 1:
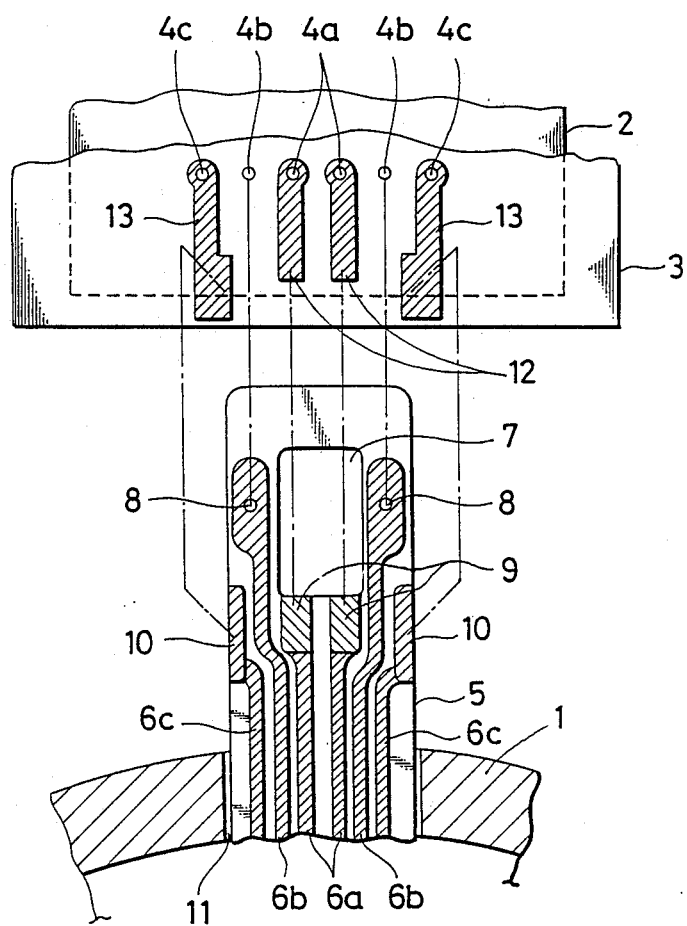
FIG. 1 is a schematic view of a flat cable connecting device showing an embodiment of the present invention.
Figure 2:
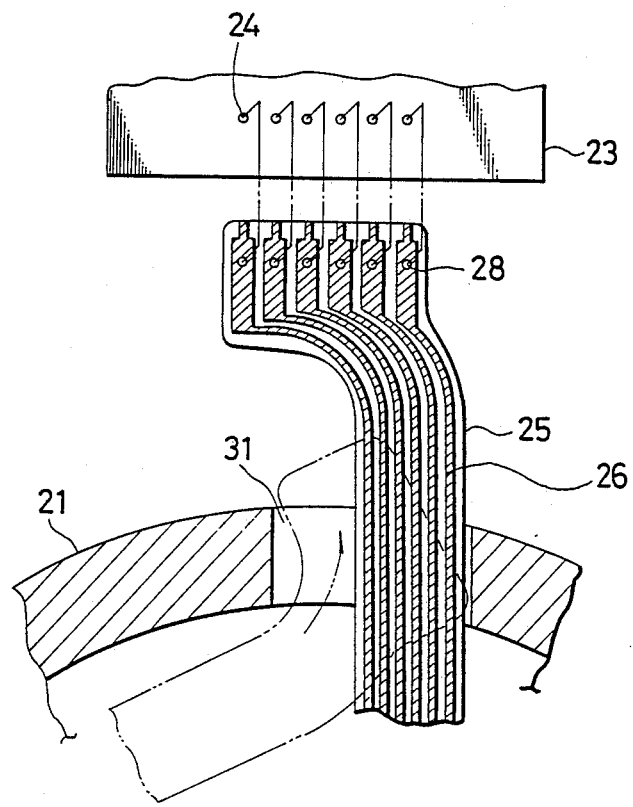
FIG. 2 is a similar view but illustrating a typical one of conventional flat cable connecting devices.
Figure 3:
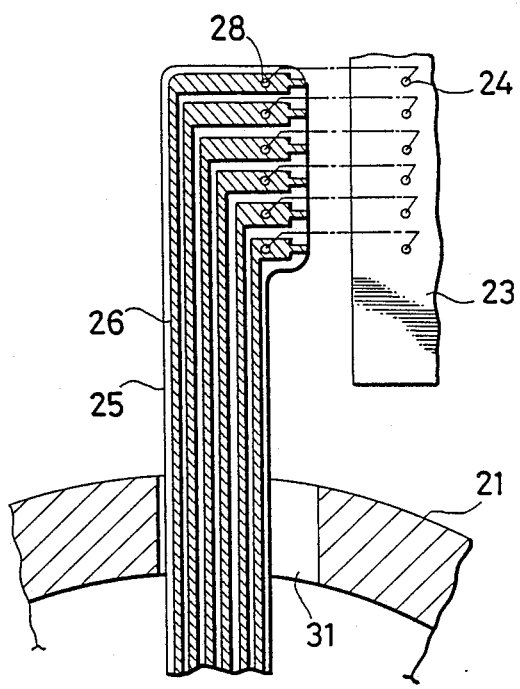
FIG. 3 is a similar view but illustrating another typical conventional flat cable connecting device.
Figure 4:
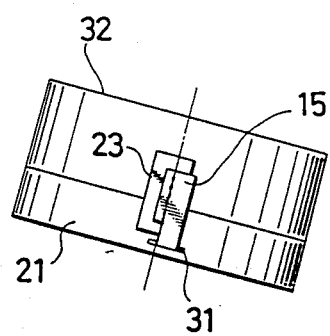
FIG. 4 is a side elevational view, in a reduced scale, of a rotary head of a video tape recorder to which the flat cable connecting device of FIG. 3 is applied.

Referring to FIG. 1, there is shown a flat cable connecting device according to the present invention wherein it is applied to a rotary head in a video tape recorder. The rotary head of the video tape recorder includes a stationary cylinder 1, a rotary transformer (not shown) located within the rotary head, a connector body 2, and printed circuit board 3 connected thereto located outside the rotary head. A plurality of (for example, 6) connector pins 4a, 4b, 4c are disposed in a lateral row on the printed circuit board 3.

A flat cable 5 is provided for connecting the rotary transformer and the connector pins 4a, 4b, 4c to each other and has a plurality of (for example, 6) printed wires 6a, 6b, 6c formed thereon. A rectangular hole 7 is formed at the same end of the flat cable 5 at which the flat cable 5 is connected to the connector pins 4a, 4b, 4c, and a pair of small holes 8 for receiving the connector pins 4b therein are formed at portions of the end of the flat cable 5 on opposite sides of the rectangular hole 7.

The flat cable 5 further has a pair of printed wire connecting conducting areas of sections 9 formed at portions of one edge of the angular hole 7 thereof. The printed wire connecting conducting areas are contiguous with the two centrally located printed wires 6a.

The two printed wires 6b adjacent the two printed wires 6a extend to the portions of the flat cable 5 at which the small holes 8 are perforated and thus surround the small holes 8.

A pair of printed wire connecting conducting areas or sections 10 are formed at opposite side edges adjacent the connecting end of the flat cable 5 in a contiguous relationship to the two printed wires 6c located at outermost positions of the flat cable 5.

It can be seen from FIG. 1 that the connecting end of the flat cable 5 is not widened, but has the same width as the body portion of the flat cable. The flat cable 5 extends through a slit 11 formed in a partition wall, that is, a circumferential wall of the stationary cylinder 1.

Meanwhile, the printed circuit board 3 has formed by printing thereon a pair of conductor sections 12 for electrically connecting the two centrally located connector pins 4a and the pair of printed wire connecting sections 9 at the edge of the angular hole 7 to each other, and another pair of conductor sections 13 for electrically connecting the outermost connector pins 4c and the pair of printed wire connecting sections 10 at the opposite side edges of the flat cable 5 to each other.

With the arrangement described above, in connecting the flat cable 5 to the connector pins 4a, 4b, 4c, the connecting end of the flat cable 5 is first passed through the slit 11 and is led out of the stationary cylinder 1. Then, the second outermost pair of connector pins 4b are passed through the small holes 8 to temporarily secure the connecting end of the flat cable 5.

After that, the connector pins 4b and the printed wires 6b are connected mechanically and electrically to each other by a suitable known means such as soldering, and then the printed wire connecting sections 9 and the conductor sections 12, as well as the printed wire connecting sections 10 and the conductor sections 13 are connected to each other in a similar manner.

In this manner, with the construction described above, the connecting end of the flat cable 5 is temporarily secured to the printed circuit board 3 by inserting the connecting pins 4b into the small holes 8. In this state, securing the electrical connection between the connector pins 4b and the printed wires 6a can be performed readily.

Thus, only two printed wires 6b are directly connected to the connector pins 4, while the other printed wires 6a, 6c are connected indirectly to the connector pins 4a, 4c, respectively, by way of the connection between the printed wire connecting sections 9, 10 to the conductor sections 12, 13 respectively. Therefore, electrical connection can be established without increasing the width of the connecting end of the flat cable 5 with respect to the width of the body portion of the same, regardless of the number and arrangement of the connector pins.

Accordingly, the size of the slit 11 must only be a little greater than the width of the flat cable 5 and hence can be minimized. Further, an operation for passing the flat cable 5 can be performed readily and efficiently since it can be passed straight through.

It is to be noted that the present invention is not limited to the embodiment described above. For example, the flat cable may otherwise have a single small hole for inserting a connecting pin therethrough. Further, the angular hole 7 need not necessarily be provided.

As apparent from the foregoing description, because the width of a connecting end of the flat cable need not be increased, the size of the slit for passing the flat cable therethrough can be minimized. Further, the operation of passing the flat cable through the slit can be performed readily and efficiently.

Having now fully described the invention, it will be apparent to one of ordinary skill in the art that many changes and modifications can be made thereto without departing from the spirit and scope of the invention as set forth herein.

What is claimed is:

1. A flat cable connecting device, comprising:
   a connector body;
   a printed circuit board connected to the connector body, said printed circuit board having a plurality of connector pins disposed thereon;
   a flat cable adapted to extend through a slit formed in a partition member, said flat cable comprising a plurality of printed wires formed thereon and at least one hole located at an end portion of the cable which receives therein at least one of said connector pins to establish mechanical and electrical connection between said flat cable and said printed circuit board, said at least one hole extending through one of said printed wires, said flat cable further comprising a plurality of printed wire connecting sections located at said end portion of the flat cable along opposing lateral edges thereof and electrically connected to printed wires of the flat cable which do not have a hole extending therethrough;
   said printed circuit board further comprising a plurality of conductor portions printed on said printed circuit board, said conductor portions electrically connecting the printed wire connecting sections to corresponding connector pins;
   wherein said flat cable further comprises a body portion which is essentially as wide as the end portion thereof.

2. A flat cable connecting device as claimed in claim 1, wherein said flat cable comprises at least one additional edge in addition to the opposing lateral edges, said at least one additional edge being located at said end portion of the flat cable, and also comprises at least one additional printed wire connecting section located along said additional edge.

3. A flat cable connecting device as claimed in claim 2, wherein said flat cable further comprises a rectangular hole formed through said end portion of the flat cable, wherein said additional edge is defined by said rectangular hole.

4. A flat cable connecting device as claimed in claim 1, further comprising a partition member having a slit, wherein the body portion and end portion of the flat cable are essentially the same width as the slit in the partition member.

* * * * *